United States Patent [19]

Pickrell et al.

[11] Patent Number: 5,350,460
[45] Date of Patent: Sep. 27, 1994

[54] HIGH TEMPERATURE PHOSPHORUS OXIDE DIFFUSION SOURCE

[75] Inventors: Gary R. Pickrell, Blacksburg, Va.; James E. Rapp, Oregon, Ohio

[73] Assignee: Techneglas, Inc., Perrysburg, Ohio

[21] Appl. No.: 986,656

[22] Filed: Dec. 8, 1992

[51] Int. Cl.$^5$ ............................ H01L 21/225
[52] U.S. Cl. ........................ 148/33; 423/263; 423/305; 423/306; 252/950; 252/951; 437/164; 437/168; 501/152
[58] Field of Search ............. 501/152; 252/950, 951; 437/164, 168; 423/263, 305, 306; 148/33

[56] References Cited

U.S. PATENT DOCUMENTS

| | | | |
|---|---|---|---|
| 4,025,464 | 5/1977 | Yamashita et al. | 252/950 |
| 4,033,790 | 7/1977 | Gunjigake et al. | 252/950 |
| 4,141,738 | 2/1979 | Rapp | 437/168 |
| 4,175,988 | 11/1979 | Rapp | 252/950 |
| 4,800,175 | 1/1989 | Rapp | 437/160 |
| 4,846,902 | 7/1989 | Pickrell | 148/33 |
| 4,891,331 | 1/1990 | Rapp | 437/164 |

FOREIGN PATENT DOCUMENTS 51-083773  7/1976  Japan .................. 252/950

*Primary Examiner*—Anthony Green
*Attorney, Agent, or Firm*—Marshall & Melhorn

[57] ABSTRACT

The present invention relates to a solid high temperature phosphorus diffusion source that is an $R_2O_3/P_2O_5$ compound in which the ratio of $R_2O_3$ to $P_2O_5$ is 1 to 3 and R is La, Y, Ce, Nd, Eu, Pt, Sm, Ho, Tb, Er, Yb, Tm or Dy. The invention also relates to a method of making the diffusion source, a method of using the diffusion source to evolve $P_2O_5$ to dope a silicon wafer, and to the doped silicon wafer.

9 Claims, No Drawings

HIGH TEMPERATURE PHOSPHORUS OXIDE DIFFUSION SOURCE

The present invention relates to a solid high temperature phosphorus diffusion source that is an $R_2O_3/P_2O_5$ compound in which the ratio of $R_2O_3$ to $P_2O_5$ is 1 to 3 and R is La, Y, Ce, Nd, Eu, Pt, Sm, Ho, Tb, Er, Yb, Tm or Dy. The invention also relates to a method of making the diffusion source, a method of using the diffusion source to evolve $P_2O_5$ to dope a silicon wafer, and to the doped silicon wafer.

BACKGROUND OF THE INVENTION

A solid diffusion source comprising glass ceramic or polycrystalline particles is disclosed in the Rapp U.S. Pat. No. 4,141,738. In U.S. Pat. No. 4,033,790 there is disclosed solid diffusion sources made by hot pressing $R_2O_3/P_2O_5$ ($La_2O_3/P_2O_5$, $Ce_2O_3/P_2O_5$ and $Y_2O_3/P_2O_5$) compounds in which the $R_2O_3$ to $P_2O_5$ is mainly 1 to 5. The above U.S. patents are incorporated by reference.

U.S. Pat. No. 4,846,902 discloses a solid diffusion source that is a Gd oxide/$P_2O_5$ compound in which the ratio of Gd oxide to $P_2O_5$ to about 1/1 to 1/5.

It is desirable to provide a solid diffusion source that is easily and efficiently made, and a source that evolves $P_2O_5$ relatively rapidly at a relatively high temperature.

OBJECTS OF THE INVENTION

It is an object of the present invention to prepare a doping composition as a diffusion source to provide a doped silicon wafer, the composition being a meta phosphate $R_2O_3/P_2O_5$ in which the ratio of $R_2O_3$ to $P_2O_5$ is 1 to 3 and R is La, Y, Ce, Nd, Eu, Pr, Sm, Ho, Tb, Er, Yb, Tm or Dy.

It is an object of the present invention to provide a method of making a doped silicon wafer using a solid diffusion source, the method comprising the steps of:

A. heating $R_2O_3$ oxide and $H_3PO_4$ to provide a $R_2O_3$ oxide/$P_2O_5$ composition consisting essentially of a $R_2O_3/P_2O_5$ compound in which the ratio of $R_2O_3$ to $P_2O_5$ is 1 to 3 and R is La, Y, Ce, Nd, Eu, Pt, Sm, Ho, Tb, Er, Tm, Yb or Dy.

B. firing the composition to evolve $P_2O_5$ to deposit a phosphorus containing coating on the silicon wafer at a relatively high temperature and at a relatively high rate to form a glassy layer on the silicon wafer.

These and other objects will be apparent from the specification that follows and the appended claims.

SUMMARY OF THE INVENTION

The present invention provides a composition for a solid diffusion source to deposit a phosphorus oxide coating on a silicon wafer, the composition consisting essentially of an $R_2O_3/P_2O_5$ compound in which the ratio of $R_2O_3$ to $P_2O_5$ is about 1 to 3, and R is La, Y, Ce, Nd, Eu, Pr, Sm, Ho, Tb, Er, Yb, Tm or Dy. The present invention also provides the $R_2O_3 \cdot 3P_2O_5$ compound in which it contains $SrO_2$.

The present invention also includes a method of using the doping source by firing it at about 950° C. up to about 1165° or 1200° C. and the doped silicon wafer itself.

The present invention also provides a method of making and using the doping source at a temperature preferably at about 975° C. to 1125° C. or above.

The present invention also provides a doping composition in which the above described meta phosphate doping compound contains $ZrO_2$.

DETAILED DESCRIPTION OF THE INVENTION

In the present invention, R is Group IIIa element (according to the Periodic Chart of the Elements, Page 46 of the International Critisol Tables of Numerical Data, Physics, Chemistry and Technology, 1926, McGraw-Hill). The suitable group IIIa elements have atomic numbers from 37-70 but not 64.

In one aspect, the R element has an atomic number from 39-57 (Y and La) or 58-63 (Ce, Pr, Nd, Sm and Eu). Suitable R elements also have an atomic number from 65-70 (Tb, Dy, Ho, Er, Tm and Yb).

Y is a preferred R element as are La, Yb, Ce, Dy, Er and Sm—these compounds being colorless or white or near white. Y is highly preferred in some applications, it evolving $P_2O_5$ at a high rate at about 950° C. or 1000° C. to 1165° or 1175° C., it being fired preferably at least about 1000° C. and optimally at about 1050° to 1150° C. to provide a glassy film of about 800-1000 A° on a silicon wafer in one hour.

EXAMPLE 1

Various $R_2O_3 \cdot 3P_2O_5$ sources were prepared using stoichiometric amounts of $R_2O_3$ and $P_2O_5$ (in the $H_3PO_4$ starting material) as described in the Pickrell U.S. Pat. No. 4,846,902 for $Gd_2O_3 \cdot 5P_2O_5$ materials and in U.S. Pat. No. 4,033,790 for $R_2O_3 \cdot 5P_2O_5$ materials.

In each case, the $R_2O_3$ was mixed with an appropriate stoichiometric amount of $H_3PO$. The excess water is evaporated, and the mixed product fired at 750° C. for 15 hours to provide the $R_2O_3 \cdot 3P_2O_5$ product.

The fired material was pressed and sintered as in the U.S. Pat. No. 4,033,790, the resultant billet being sliced into individual diffusion source wafers.

In a typical formulation, the following was mixed in approximate grams to provide the following approximate stoichiometric amounts of 1 mole $R_2O_3$ and 3 moles $P_2O_5$ mixture:

| Ingredients | Grams |
| --- | --- |
| Lanthanum Oxide 1 mole ($La_2O_3$) to 3 moles ($P_2O_5$) | 107 |
| $H_3PO_4$ (85%) | 230 |

The procedure followed is set forth in the aforementioned Pickrell U.S. Pat. No. 4,846,902, the water of the $R_2O_3/P_2O_5$ mixture being driven off the mixture by heating at 150° C. Thereafter, the crucible was covered and fired at 750° C. for 15 hours to provide the lanthanum oxide/$3P_2O_5$ product. The resultant crystalline product was ball-milled to obtain a fine powder ($-60$ mesh).

Silicon wafer and the metaphosphate source made from the sintered powder were heated to 1075° C. and the metaphosphate source fired at 1075° C. for 1 hour to evolve $P_2O_3$ and coat the heated wafers with a glassy film of about 1000A° in thickness. This is a sufficient amount of glass to satisfactorily dope the silicon wafers with phosphorus at 1075° C. Excellent film thickness also was obtained by firing for 1 hour at 975° C. to 1125° C. and as high as 1165° C.

Other doping source $R_2O_3 \cdot 3P_2O_5$ compounds were prepared and fired for 1 hour to evolve $P_2O_5$ at the temperature indicated in the table below to coat silicon wafers with a glassy film of about 500–2500A°.

| $R_2O_3 \cdot 3P_2O_5$ Compound | Firing Temperature °C. |
| --- | --- |
| $La_2O_3 \cdot 3P_2O_5$ | 975–1165 |
| $Y_2O_3 \cdot 3P_2O_5$ | 975–1165 |
| $Pr_2O_3 \cdot 3P_2O_5$ | 1025–1125 or 1165 |
| $Nd_2O_3 \cdot 3P_2O_5$ | 1000–1125 or 1165 |
| $Sm_2O_3 \cdot 3P_2O_5$ | 1075–1165 |
| $Dy_2O_3 \cdot 3P_2O_5$ | 1000–1075 or 1165 |
| $Er_2O_3 \cdot 3P_2O_5$ | 950–1165 |
| $La_2O_3 \cdot ZrO_2 \cdot 3P_2O_5$ | 975–1125 or 1165 |

As in the case of $La_2O_3 \cdot ZrO_2 \cdot 3P_2O_5$, substantially similar results can be obtained by the use of $ZrO_2$ in the other rare earth oxide/$\cdot 3P_2O_5$ compounds.

In the $R_2O_3 \cdot 3P_2O_5$ compounds, R is a Group IIIa rare earth element (International Critical Tables) having an atomic number as follows:

| R | Atomic Number |
| --- | --- |
| Y (or Yt) | 39 |
| La | 57 |
| Ce | 58 |
| Pr | 59 |
| Nd | 60 |
| Sm | 62 |
| Eu | 63 |
| Tb | 65 |
| Dy | 66 |
| Ho | 67 |
| Er | 68 |
| Tm (or Tu) | 69 |
| Yb | 70 |

The preferred R elements are Group IIIa elements Y and La, having atomic numbers of 39–57, respectively. Also preferred for some applications are Yb, Ce, Dy, Er and Sm, the resultant compounds being colorless or white or near white.

Good results are obtained when the Group IIIa element has an atomic number of from 58 to 63 or from 65 to 70.

The above examples illustrate the $R_2O_3 \cdot 3P_2O_5$ diffusion sources, the methods of making the diffusion sources, the methods of using the sources by firing the same to evolve $P_2O_5$, and methods of making the doped silicon wafers that are useful in a typical emitter diffusion, in channel MOS diffusion and in doping of a polysilicon layer without undesirable toxic gases and liquids.

Lanthanum Pentaphosphate was held at 1000° C. to convert it to Lanthanum Metaphosphaste, after losing about 26% of its weight. The source was used to dope silicon at 1100° C. for 1 hour. A glassy layer of 1000A° was deposited on the silicon and it had a sheet resistivity of 2.65 ohm/square ($\Omega/\square$).

The metaphosphates of Dy, Gd, Er and Y were prepared and ground into fine powders for screen printing on silicon. Doping tests at 1100° C. and 1150° C. indicated that ErP3 (erbium oxide/$3P_2O_5$), YP3 and ErP5 can be used as sources at temperature as high as 1100° C.

A sample of lanthanum zirconium phostphate (meta) was prepared, made into a fine powder and deposited on a silicon wafer. After firing at 1200° C. for 1 hour, the residual material etched away in HF in 1 hour. The silicon exhibited a gold-brown color and had a sheet resistivity of 0.4 ohm/square ($\Omega/\square$). It was used as a satisfactory deep junction diode.

What is claimed is:

1. A composition for a solid diffusion source to deposit a phosphorus oxide coating on a silicon wafer, the composition consisting essentially of an $R_2O_3/P_2O_5$ compound in which the ratio of $R_2O_3$ to $P_2O_5$ is about 1:3, and R is La, Y, Ce, Nd, Eu, Pr, Sm, Ho, Tb, Er, Yb, Tm or Dy.

2. A composition as defined in claim 1 in which R is La or Y.

3. A composition as defined in claim 1 in which R is Ce.

4. A composition as defined in claim 1 in which R is Nd, Eu, Pr or Sm.

5. A composition as defined in claim 1 in which R is Sm, Ho, Tb, Er, Yb, Tm or Dy.

6. A composition as defined in claim 1 in which R is Er.

7. A composition as defined in claim 1 in which R is Sm.

8. A composition as defined in claim 1 in which the $R_2O_3/P_2O_5$ compound contains $ZrO_2$.

9. A composition as defined in claim 1 in which the compound is $Ce_2O_3 \cdot 3P_2O_5$.

* * * * *